(12) United States Patent
Doyle et al.

(10) Patent No.: US 6,570,220 B2
(45) Date of Patent: *May 27, 2003

(54) FABRICATION OF DEEP SUBMICRON STRUCTURES AND QUANTUM WIRE TRANSISTORS USING HARD-MASK TRANSISTOR WIDTH DEFINITION

(75) Inventors: Brian S. Doyle, Cupertino, CA (US); Peng Cheng, Campbell, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/524,986

(22) Filed: Mar. 14, 2000

(65) Prior Publication Data

US 2002/0043690 A1 Apr. 18, 2002

Related U.S. Application Data

(62) Division of application No. 08/939,578, filed on Sep. 29, 1997, now Pat. No. 6,063,688.

(51) Int. Cl.⁷ .................. H01L 29/76; H01L 27/148
(52) U.S. Cl. .................. 257/345; 257/241; 257/244
(58) Field of Search ................. 257/372, 374, 257/375, 396, 397, 394, 395, 510, 513, 546, 547, 550, 241, 242, 243, 244, 401–404, 345; 438/207, 218, 219, 225, 297, 439, 452, 424

(56) References Cited

U.S. PATENT DOCUMENTS 5,482,885 A * 1/1996 Lur et al. .................. 438/396
5,554,568 A * 9/1996 Wen ........................... 438/197
5,717,239 A * 2/1998 Nagai ......................... 257/365
6,111,296 A * 8/2000 Yamazaki et al. .......... 257/401

FOREIGN PATENT DOCUMENTS

JP 62-229978 * 10/1987

OTHER PUBLICATIONS

S. Wolf, Silicon Processing for the VLSI Era, vol. 2, Lattice Press, pp. 45–58, 1990.*

* cited by examiner

Primary Examiner—Steven Loke
Assistant Examiner—Hung Kim Vu
(74) Attorney, Agent, or Firm—Blakely, Sokoloff, Taylor & Zafman LLP

(57) ABSTRACT

The invention relates to a method of forming reduced feature size spacers. The method includes providing a semiconductor substrate having an area region; patterning a first spacer over a portion of the area region of the substrate, the first spacer having a first thickness and opposing side portions; patterning a pair of second spacers, each second spacer adjacent to a side portion of the first spacer, each second spacer having a second thickness in opposing side portions, wherein the second thickness is less than the first thickness; removing the first spacer; patterning a plurality of third spacers, each third spacer adjacent to one of the side portions of one of the second spacers, each one of the third spacers having a third thickness, wherein the third thickness is less than the second thickness; and removing the second spacers. The invention also relates to a field of effect transistor. The transistor includes a semiconductor substrate having a source region and a drain region; a gate area of the substrate surface; a channel region in the substrate having a cross-sectional area defined by a portion of the gate area, a channel length measured accross a portion of the channel region between the source region and the drain region; and a trench formed in a portion of the channel region, the trench having a trench length substantially equivalent to the channel length.

7 Claims, 11 Drawing Sheets

FABRICATION OF DEEP SUBMICRON STRUCTURES AND QUANTUM WIRE TRANSISTORS USING HARD-MASK TRANSISTOR WIDTH DEFINITION

This application is a divisional of application Ser. No. 08/939,578, which issued as U.S. Pat. No. 6,063,688 on May 16. 2000.

BACKGROUND OF THE INVENTION

1. Field of the Invention

The invention relates to semiconductor devices and more particularly to reduced feature size devices and the fabrication of the same.

2. Description of Related Art

A major goal of metal oxide semiconductor field effect transistor (MOSFET) scaling is to increase the density and speed of the integrated circuits in which such scaled-down devices are utilized. Devices are formed on a semiconductor substrate typically by depositing material and then patterning that material to remove specific portions on the wafer surface. Optical lithography has been used to pattern and generate device structures down to 0.2 micron ($\mu$m) geometry. As the minimum feature size continues to be scaled down to sub-0.10 $\mu$m, other techniques, such as electron-beam (E-beam) lithography, x-ray lithography, or extreme ultraviolet (EUV) lithography have been attempted. These latter lithography methods are generally expensive and have presented many technical barriers to widespread use.

As technologies shrink, it is increasingly difficult to obtain performance increases. Increasing device density typically means using devices with smaller channel lengths and widths. Increasing the speed of integrated circuits is generally accomplished by increasing the saturation drain current ($I_{Dsat}$). Increasing the MOSFET $I_{Dsat}$ allows faster charging and discharging of parasitic capacitances. $I_{Dsat}$ is increased typically by either a decrease in the channel length or a decrease in the gate oxide thickness.

One factor that has not proved possible to scale is the transistor mobility. The electron and hole mobilities are a measure of the ease of carrier motion in a semiconductor crystal. In the semiconductor bulk, the carrier mobilities are typically determined by the amount of lattice scattering and ionized impurity scattering taking place inside the material. Carrier transport in the MOSFET, however, primarily occurs in the surface inversion layer. In small feature size devices, the mobility due to the gate-induced electric field (i.e., transverse electric field) and drain-induced electric field (i.e., longitudinal electric field) act on the carriers and significantly influence the velocity of the moving carriers in the inversion layer of a device channel. The drain-induced electric field acts to accelerate the carriers parallel to the Si—SiO$_2$ interface, whereupon the carrier suffers scattering similar to as in the bulk. The gate-induced electric field, however, also causes the carriers to be accelerated toward the Si—SiO$_2$ surface. Thus, the carriers near the surface experience additional motion-impeding collisions with the silicon surface. As a result, the carrier mobility at the surface is observed to be lower than in the bulk. These and other scattering mechanisms cause the mobility to saturate at what is termed velocity saturation. Velocity saturation prevents increases in mobility expected from decreases in gate length.

It has been shown theoretically that it is possible to greatly enhance the mobility of a silicon MOS transistor by an order of magnitude if the width of the device is of the order of 100 angstroms (Å). This conclusion rises from the fact that the width of the transistor (i.e., the channel) is of a dimension such that it forms a potential box, that causes thin strips of the channel to become quantized in the width direction, similar to the quantization of the inversion layer in the MOS transistor in the "Z" direction (at the gate oxide interface). With strips of channel of approximating 100 Å width, the inversion layer becomes quantized in the width direction resulting in an inversion layer for these very thin transistors that resembles a series of quantum wires, with the density of electrons limited to the middle of the channel. Consequently, these transistors do not suffer the two-dimensional scattering that MOSFET devices normally undergo. The consequences of this are that it is possible to obtain transistors whose mobilities are theoretically increased by at least an order of magnitude over conventional devices. However, forming transistors on the order of 100 Å and quantizing the transistors' channels has to date been difficult to achieve with existing formation techniques.

SUMMARY OF THE INVENTION

A method of forming reduced feature size spacers is disclosed. The method includes providing a semiconductor substrate having an area region; patterning a first spacer over a portion of the area region of the substrate, the first spacer having a first thickness and opposing side portions; patterning a pair of second spacers, each second spacer adjacent to a side portion of the first spacer, each second spacer having a second thickness in opposing side portions, wherein the second thickness is less than the first thickness; removing the first spacer; patterning a plurality of third spacers, each third spacer adjacent to one of the side portions of one of the second spacers, each one of the third spacers having a third thickness, wherein the third thickness is less than the second thickness; and removing the second spacers. A semiconductor apparatus formed by this method is also disclosed.

A field of effect transistor is further disclosed. The transistor includes a semiconductor substrate having a source region and a drain region; a gate area of the substrate surface; a channel region in the substrate having a cross-sectional area defined by a portion of the gate area, a channel length measured across a portion of the channel region between the source region and the drain region; and a trench formed in a portion of the channel region, the trench having a trench length substantially equivalent to the channel length.

Additional features and benefits of the invention will become apparent from the detailed description, figures, and claims set forth below.

DETAILED DESCRIPTION OF THE INVENTION

Embodiments in accordance with the invention include a method of forming reduced feature size spacers and a semiconductor apparatus formed by such method. The method includes providing a semiconductor substrate having an active region; patterning a first spacer over a portion of the area region of the substrate, the first spacer having a first thickness and opposing side portions; patterning a pair of second spacers, each second spacer adjacent to a side portion of the first spacer, each second spacer having a second thickness and opposing side portions, wherein the second thickness is less than the first thickness; removing the first spacer; patterning a plurality of third spacers, each third spacer adjacent to one of the side portions of one of the second spacers, each one of the third spacers having a third thickness, wherein the third thickness is less than the second thickness; and removing the second spacers. The patterning of subsequent spacers and removal of previous spacers can be repeated until desired submicron spacers are obtained. The method can be used for fabricating multiple deep submicron lines, spaces, dots, and boxes without submicron lithography. The same principle may be used to generate different patterns, such as squares and circles. The process is scalable below 100 Å.

Embodiments in accordance with the invention also include a field effect transistor and a method of forming a field effect transistor. The field effect transistor includes a semiconductor substrate having a source region and a drain region; a gate area of the substrate surface; a channel region in the substrate having a cross-sectional area defined by a portion of the gate area, a channel length measured across a portion of the channel region between the source region and the drain region; and a trench formed in a portion of the channel region, the trench having a trench length substantially equivalent to the channel length.

Other embodiments include, but are not limited to, a field effect transistor and a method of forming a field effect transistor having multiple trenches filled with dielectric material extended about the width of the gate area. The plurality of dielectric-filled trenches define areas of the substrate in the channel region that act like quantum wire channels that offer much higher drain current drive than conventional devices with the same total channel width.

In the following description, numerous specific details are set forth, such as specific materials, thicknesses, processing step, process parameters, etc., in order to provide a thorough understanding of the invention. It is to be appreciated that one skilled in the art would understand these specific details need not be employed to practice the invention.

Figure 1:
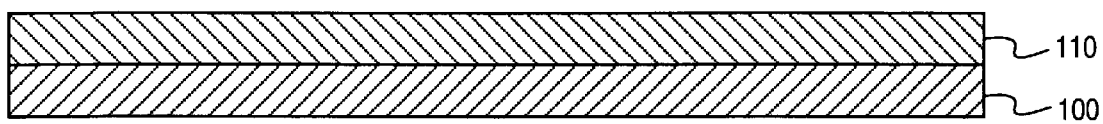
FIG. 1 is a schematic planar side view of a portion of a semiconductor substrate showing a masking layer overlying the substrate in accordance with a first embodiment of the invention.
Figure 2:
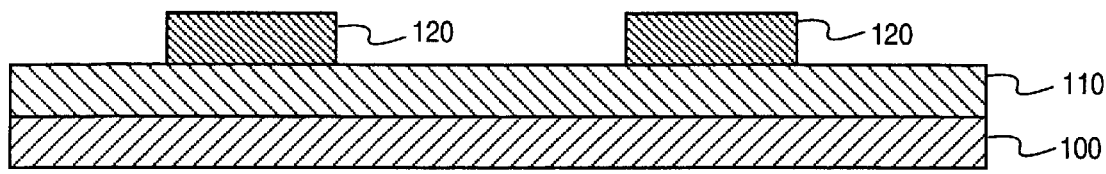
FIG. 2 is a schematic planar side view of a portion of a semiconductor substrate wherein a photolithographic resist is formed over a masking layer to define two spacer regions over the substrate in accordance with a first embodiment of the invention.

FIGS. 1–12 illustrate a method of forming geometrically reducing spacers in accordance with an embodiment of the invention. FIG. 1 shows a semiconductor substrate 100, such as for example, a silicon semiconductor substrate. Overlying substrate 100 is a first material layer 110, such as for example, a silicon nitride ($Si_3N_4$) layer. Next, as shown in FIG. 2, a photoresist is applied and patterned to define two resist lines 120 with a width of 0.32 μm and having a 0.64 micron space between the resist lines 120. The application and patterning of photoresist lines 120 is done in accordance with known techniques, such as for example with a negative resist and light-field mask. Photoresist lines 120 are used to define spacer portions of first material 110, such as for example spacer portions 110 of $Si_3N_4$.

Figure 3:
FIG. 3 is a schematic planar side view of a portion of a semiconductor substrate wherein two masking layer spacers overlie the substrate in accordance with a first embodiment of the invention.

Once resist 120 is patterned, first material layer 110 is etched with a suitable etchant. In the case where first material layer 110 is $Si_3N_4$, a suitable etchant is a $CHF_3/O_2$ chemistry. The etch removes first material layer from the unprotected portions of the substrate leaving first material spacer portions 110 remaining under photoresist 120. Next, photoresist 120 is removed by conventional techniques. FIG. 3 shows a schematic side view of the structure after the removal of the photoresist.

Figure 4:
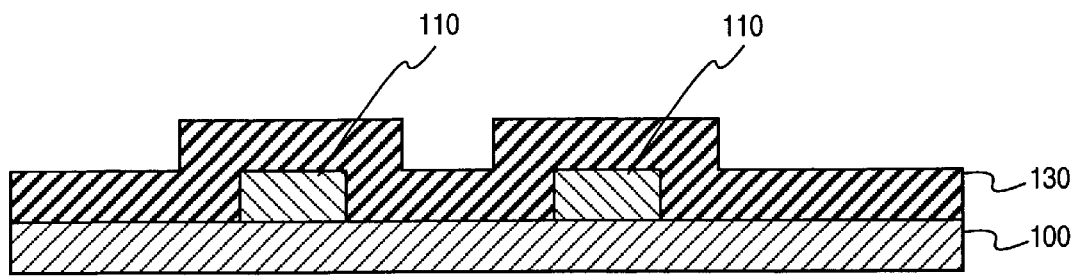
FIG. 4 is a schematic planar side view of a portion of a semiconductor substrate wherein a second spacer material is deposited over the substrate and the pair of masking spacers in accordance with a first embodiment of the invention.

As shown in FIG. 4, a second masking layer 130 is conformally deposited over first spacer portions 110 on substrate 100. Second material layer 130 is, for example, a silicon dioxide ($SiO_2$) deposited by conventional techniques, such as for example chemical vapor deposition. Second material portion 130 should be different from the material used to make first material spacers 110 to allow a subsequent selective etch to differentiate between the two materials.

Figure 5:
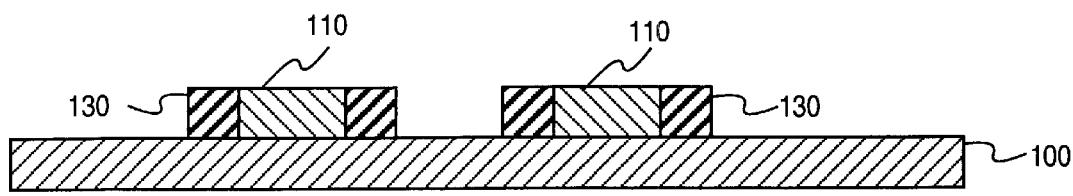
FIG. 5 is a schematic planar side view of a portion of a semiconductor substrate wherein second spacers are formed adjacent to the pair of first spacers in accordance with a first embodiment of the invention.

In the embodiment shown, the thickness of second material layer 130 is approximately one half of the width of first material portion 110. Thus, for example, where the thickness of first material portion 110 is 0.32 μm, the thickness of second material portion layer 130 is 0.16 μm. Next, as illustrated in FIG. 5, an etchant is used to etch second material layer 130 to form second material spacer portions 130 adjacent first material spacer portions 110. The etchant should be anisotropic to define spacer portions having substantially vertical sidewalls as shown in FIG. 5. For a second material portion 130 of $SiO_2$, a $CHF_3/O_2$ etch chemistry is used to form second material spacer portions 130 with substantially vertical sidewalls.

Figure 6:
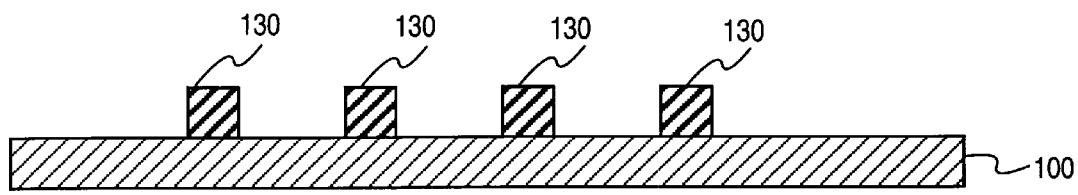
FIG. 6 is a schematic planar side view of a portion of a semiconductor substrate wherein second spacer portions overlie the substrate surface in accordance with a first embodiment of the invention.

Once second material spacers 130 are formed, first spacer portions 110 are removed by a suitable etchant. In this case, an etchant is selected for first material portion 110 that is selective for first material portion 110 and that does not significantly etch second material portion 130. A suitable selective etch for $Si_3N_4$ first material portions 110 and $SiO_2$ second material spacer portions 130, to selectively etch $Si_3N_4$ is a wet etch of hot phosphoric acid ($H_3PO_4$). Thus, FIG. 6 shows second material spacer portions 130 each having a width of for example 0.16 μm on the surface of substrate 100 after the etch of first material portions 110.

Figure 7:
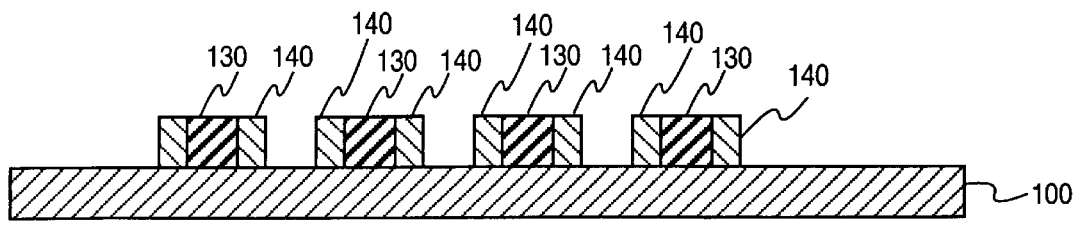
FIG. 7 is a schematic planar side view of a portion of a semiconductor substrate wherein a third spacer material is deposited over the substrate and the second spacers and patterned into third spacers adjacent the second spacers in accordance with a first embodiment of the invention.

The above process is continued to create smaller spacer portions. In FIG. 7, a third material layer 140 is conformally deposited over substrate 100 and second material spacers 130 to a thickness of approximately one half the thickness of second material spacer portions 130. Using the above examples, third material spacer portions 140 would be deposited to a thickness of approximately 0.08 μm. The third material layer 140 may also be the same material as was used in first material layer 110. For example, third material layer 140 may be $Si_3N_4$. Next, with a suitable etchant, the third material layer 140 is formed into third material spacer portions 140 adjacent the sidewalls of third material spacer portions 130. As noted above, the etchant is anisotropic to create third material spacer portions 140 with substantially vertical sidewalls.

Figure 8:
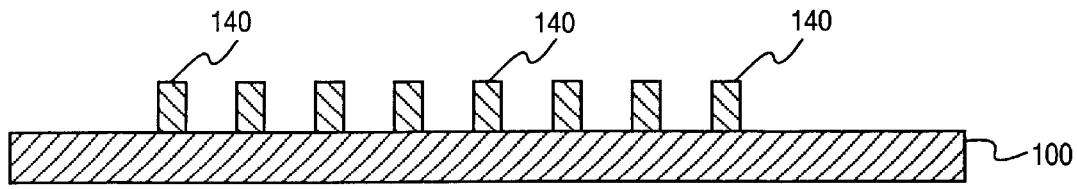
FIG. 8 is a schematic planar side view of a portion of a semiconductor substrate wherein third spacers overlie the semiconductor substrate in accordance with a first embodiment of the invention.

Once third material spacer portions 140 are formed, second material spacer portions 130 are etched with a selective etchant that selectively etches second material spacer portions 130 to the exclusion of third material spacer portions 140. For example, where second material spacer portions 130 are of $SiO_2$ and third material spacer portions are of $Si_3N_4$, a suitable etchant is a wet etch of HF. FIG. 8 illustrates the structure after second material spacer portions 130 have been etched away leaving third material spacer portions 140 each having a width of 0.08 μm left on substrate 100.

Figure 9:
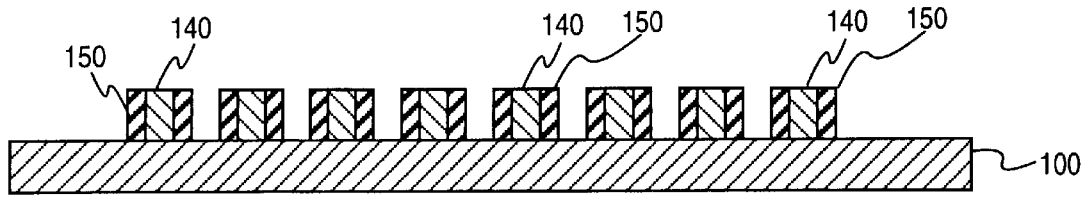
FIG. 9 is a schematic planar side view of a portion of a semiconductor substrate wherein a fourth spacer material is deposited over the third spacer portions and patterned into fourth spacer portions adjacent the third spacer portions in accordance with a first embodiment of the invention.
Figure 10:
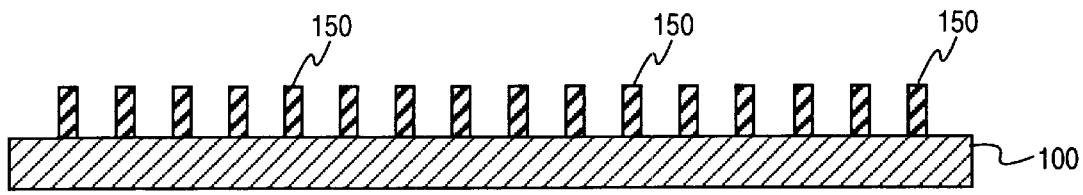
FIG. 10 is a schematic planar side view of a portion of a semiconductor substrate wherein fourth spacer portions overlie the semiconductor substrate surface in accordance with a first embodiment of the invention.
Figure 11:
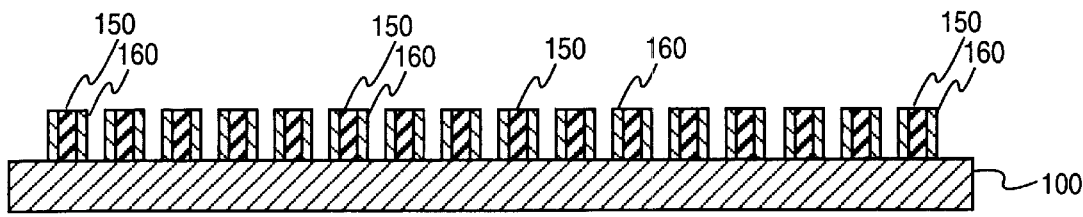
FIG. 11 is a schematic planar side view of a portion of a semiconductor substrate wherein a fifth spacer material is deposited over the substrate and the fourth spacer portions and patterned into fifth spacer portions adjacent the fourth spacer portions in accordance with a first embodiment of the invention.
Figure 12:
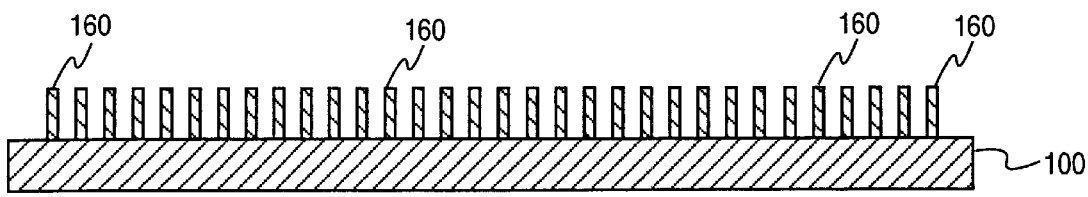
FIG. 12 is a schematic planar side view of a portion of a semiconductor substrate wherein fifth spacer portions overlie the semiconductor substrate surface in accordance with a first embodiment of the invention.

FIG. 9 shows the subsequent step wherein fourth material spacer portions 150 are formed adjacent third material spacer portions 140 by the techniques described above. Specifically, fourth material spacer portions 150 are formed by conformally depositing a fourth material layer, such as for example $SiO_2$, over substrate 100 at a thickness equal to one half the width of third material spacer portions 140. A suitable etchant, such as for example, $CHF_3/O_2$ is used to anisotropically etch fourth material spacer portions 150. Next, as shown in FIG. 10, third material spacer portions 140 are selectively etched away from the surface of substrate 100, leaving only fourth material spacer portions 150. The process is repeated in FIGS. 11 and 12 by the conformal deposition of a fifth material layer at one half the thickness of the width of fourth material spacer portions 150 to form fifth material spacer portions 160 of for example $Si_3N_4$. Fourth material spacer portions 150 are then selectively etched leaving only fifth material spacer portions 160 on the surface of substrate 100 as shown in FIG. 12.

The process illustrated in FIGS. 1–12 wherein the thickness of two first material spacer portions 110 was 0.32 μm and spaced 0.64 μm apart with subsequent spacers having a thickness of approximately one-half the previous spacers results in fifth material spacer portions 160 each having approximately a 200 Å width and separated from one another by approximately 400 Å. The spacer portions formed in this embodiment can be used, for example, as spacers for the formation of trenches in the substrate surface, to make for example, quantum wires as described in a subsequent embodiment described herein. Further, it is not necessary that the geometrically related submicron spacer portions (or any of the previously formed spacer portions) be dielectric material. The final spacer portions, for example, could be a conductive material such as metal, e.g., quantum wires, or a semiconductor material such as polysilicon.

FIGS. 1–12 illustrated a process for forming geometrically related spacers. Each spacer was of approximately the same thickness (e.g., 200 Å) and was separated from one another by approximately the same distance (e.g., 400 Å). With the same principles as illustrated in these examples, it is possible to obtain linearly related spacers separated by the same distance as the width of such spacers. One way to formulate such a configuration is accomplished through the following algorithm:

$S_n = 2L_{n-1} + S_{n-1}$ at $n=1$, and $L=S$ where S=space width where L=line width $=S_{n-1}$ and n=number of spacer portion iterations to fabricate linearly related spacers.

Figure 13:
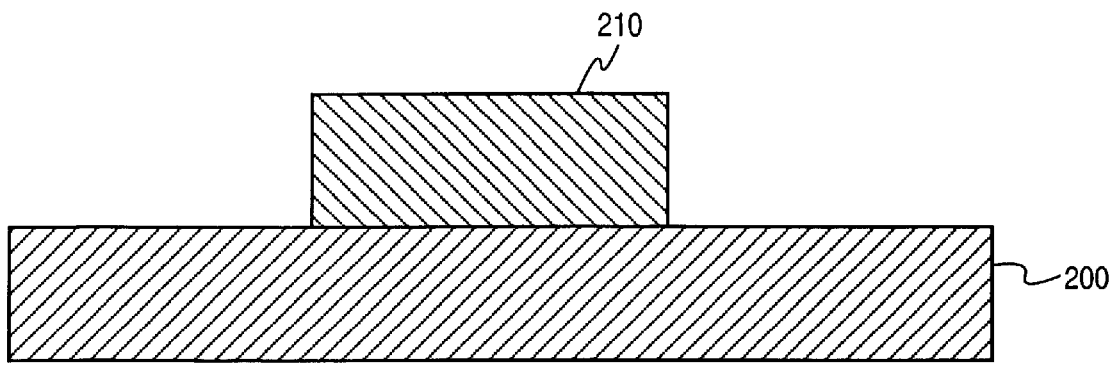
FIG. 13 is a schematic planar side view of a portion of a semiconductor substrate having a masking layer patterned over the substrate surface in accordance with a second embodiment of the invention.

FIGS. 13–21 present an example of linearly related spacers where n=5 to target a final line width (L) of, for example, 0.25 μm. First, in one embodiment, $Si_3N_4$ layer 210 is deposited over semiconductor substrate 200, such as for example a silicon substrate. A photoresist layer is then applied to define a resist line or mask with a width equal to (2n+1)L which is equal to 11 L in the example where n equals 5. Then, first material layer 210 is etched to form a first spacer portion 210. In the embodiment where the first spacer portion 210 is $Si_3N_4$, a $CHF_3/O_2$ etch chemistry is used. The etch is anisotropic to define a first spacer portion 210 with substantially vertical sidewalls as shown in FIG. 13. The line width of first spacer portion 210 is 11 L.

Figure 14:
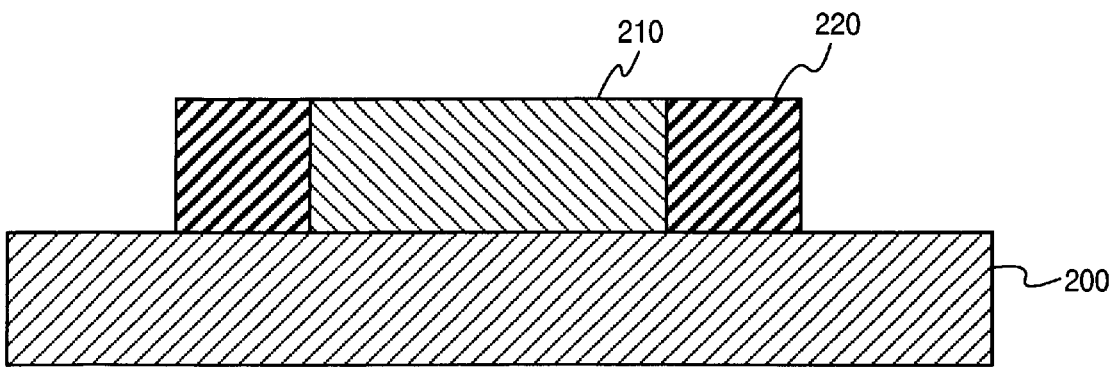
FIG. 14 is a schematic planar side view of a portion of a semiconductor substrate wherein a second masking layer is patterned into second spacer portions adjacent the first spacer portion in accordance with a second embodiment of the invention.
Figure 15:
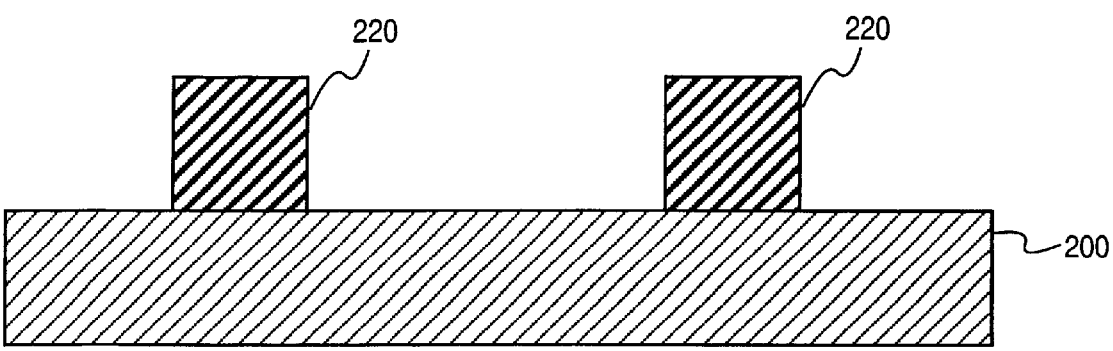
FIG. 15 is a schematic planar side view of a portion of a semiconductor substrate with a pair of second spacer portions overlying the substrate surface in accordance with a second embodiment of the invention.

As shown in FIG. 14, second material spacer portions 220, of for example, $SiO_2$ are formed on substrate 200 adjacent first material portion 210. Second material spacer portions 220 are deposited, and formed to a thickness of 5 L by a conformal deposition and anisotropic etch as described above with reference to the geometrically related submicron spacers. First material spacer portion 210 is then removed selectively so that second material spacer portions 220 are not etched. Thus, as shown in FIG. 15, only second material portions 220 having a width of 5 L are remaining on the surface of substrate 200. The space between second spacer material portions 220 is 11 L.

Figure 16:
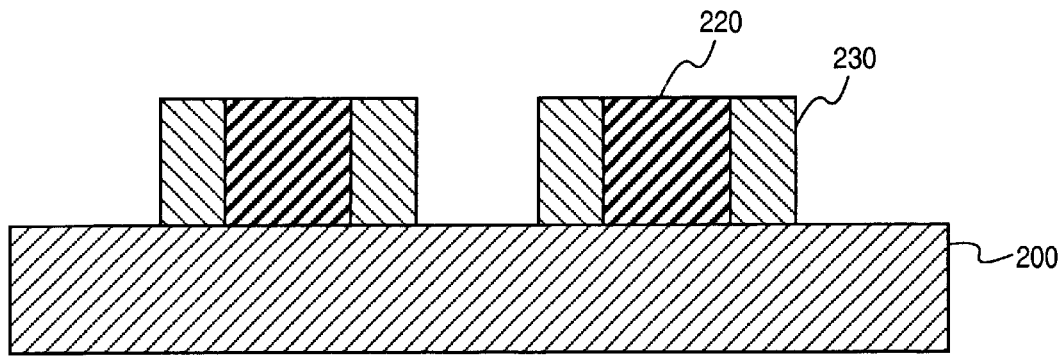
FIG. 16 is a schematic planar side view of a portion of a semiconductor substrate wherein third spacer portions are patterned adjacent second spacer portions in accordance with a second embodiment of the invention.
Figure 17:
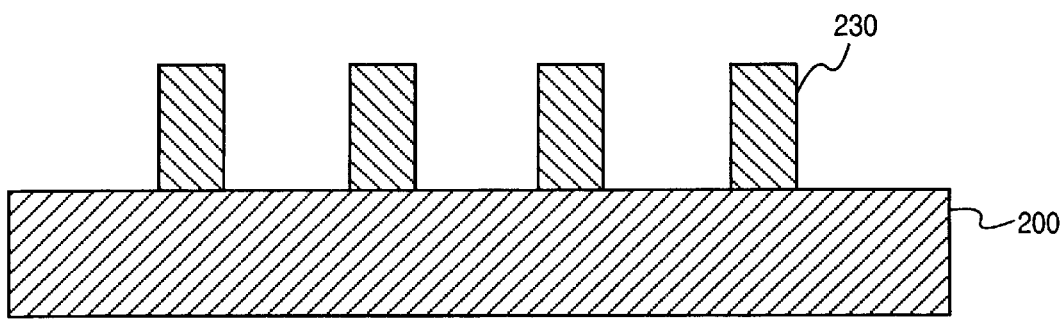
FIG. 17 is a schematic planar side view of a portion of a semiconductor substrate wherein third spacer portions overlie the semiconductor substrate surface in accordance with a second embodiment of the invention.

As shown in FIG. 16, a third material layer is conformally deposited to a thickness of 3 L and is etched anisotropically to form third material spacer portions 230 adjacent second material spacer portions 220. Third material spacer portions 230 are, for example, $Si_3N_4$. Next, as shown in FIG. 17, second material spacer portions 220 are selectively etched and removed from substrate 200. The etch does not significantly attack third spacer portions 230. The etch leaves third material spacer portions 230, such as for example, $Si_3N_4$ spacer portions, on the surface of substrate 200. The spacer width is 3 L and the spaces between third material spacer portions 230 is 5 L.

Figure 18:
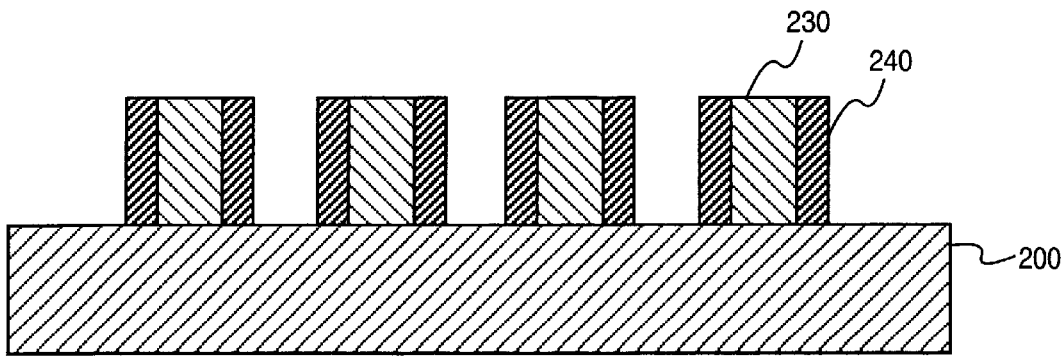
FIG. 18 is a schematic planar side view of a portion of a semiconductor substrate wherein fourth spacer portions are patterned adjacent the third spacer portion in accordance with a second embodiment of the invention.
Figure 19:
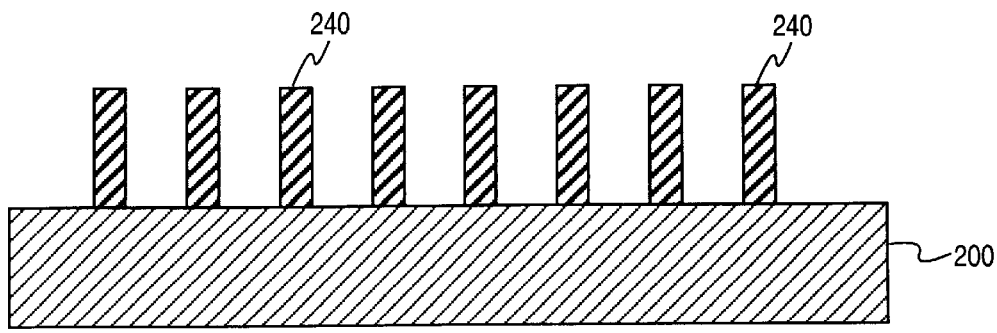
FIG. 19 is a schematic planar side view of a portion of a semiconductor substrate wherein fourth spacer portions overlie the semiconductor substrate surface in accordance with a second embodiment of the invention.

As shown in FIG. 18, a fourth material layer is conformally deposited over the structure of a thickness L. Next, through an anisotropic etch, fourth material spacer portions 240 are formed adjacent the sidewalls of third material spacer portions 230. This is followed by a selective etch to remove third material spacer portions 230 from the surface of substrate 200 leaving, as shown in FIG. 19, fourth material spacer portions 240 on the surface of substrate 100. Fourth material spacer portions 240, such as for example $SiO_2$, have a width of L and the space between the spacers is 3 L after the etch of third material spacer portions 230.

Figure 20:
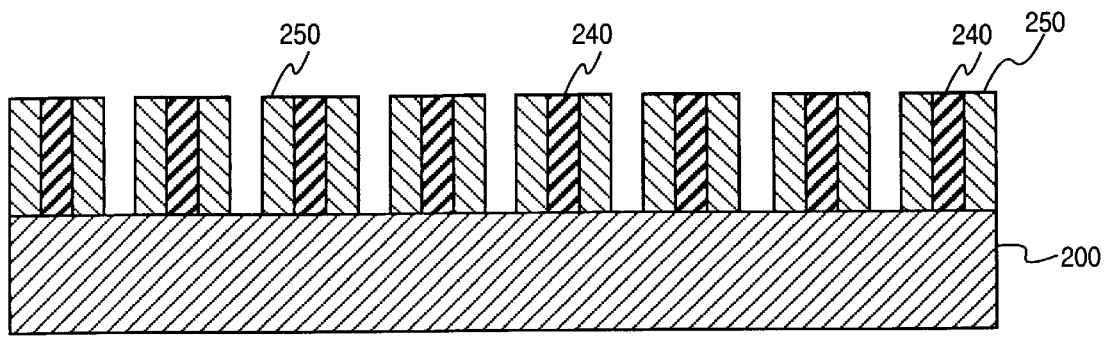
FIG. 20 is a schematic planar side view of a portion of a semiconductor substrate wherein fifth spacer portions are patterned adjacent the fourth spacer portion in accordance with a second embodiment of the invention.
Figure 21:
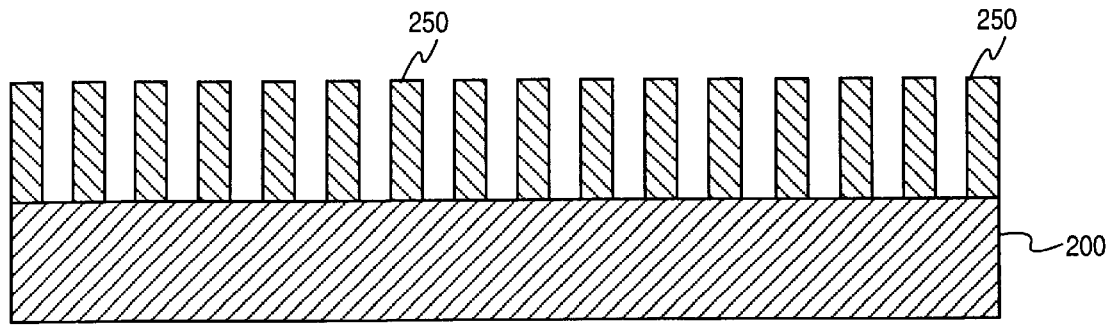
FIG. 21 is a schematic planar side view of a portion of a semiconductor substrate wherein fifth spacer portions overlie the substrate surface in accordance with an embodiment of the invention.

Next, as shown in FIG. 20, a fifth material layer 250 is conformally deposited over the structure to a thickness again of 1 L. Fifth material layer 250 can be, for example, $Si_3N_4$. Next, fifth material layer 250 is anisotropically etched into fifth material spacer portions 250 adjacent the sidewalls of fourth material spacer portions 240. Finally, fourth material spacer portions 240 are selectively etched from the surface of substrate 200 leaving only fifth material spacer portions 250 on the surface of substrate 200 as shown in FIG. 21. By this method, the width of fifth material spacer portions 250 is L and the spaces between the spacer portions is also L. Thus, the spaces are of equal size and linearly related in distance with respect to one another.

Figure 22:
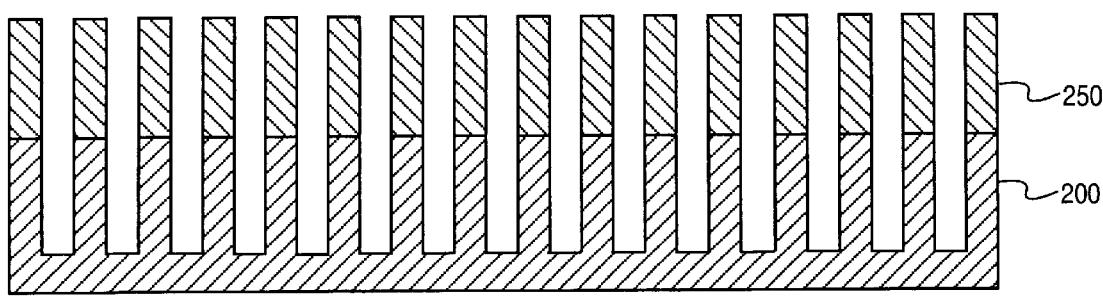
FIG. 22 is a schematic planar side view of a portion of a semiconductor substrate wherein reduced feature size spacers are used as a masking layer to define trenches in the substrate surface in accordance with a third embodiment of the invention.
Figure 23:
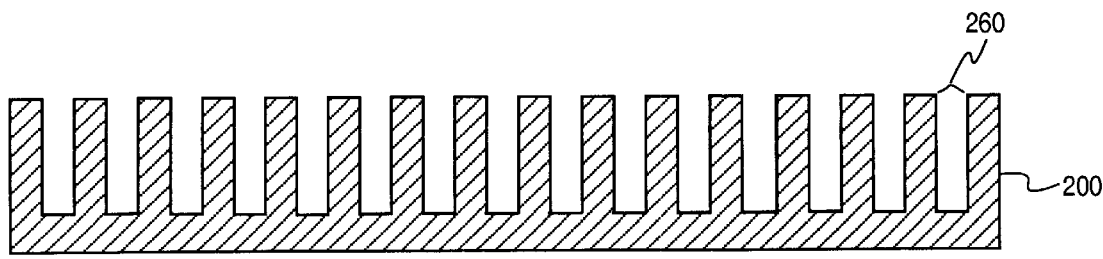
FIG. 23 is a schematic planar side view of a portion of a semiconductor substrate showing trenches defined in a substrate surface in accordance with a third embodiment of the invention.
Figure 24:
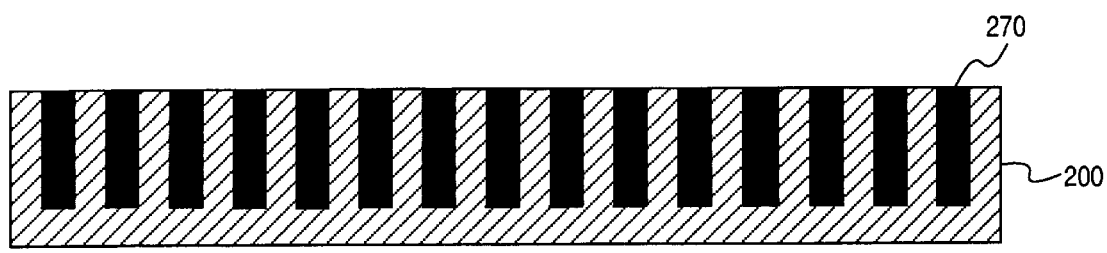
FIG. 24 is a schematic planar side view of a portion of a semiconductor substrate having trenches defined in the substrate and the trenches filled with a dielectric material in accordance with a third embodiment of the invention.

FIGS. 22–24 show an embodiment wherein submicron dimension trenches are formed in a semiconductor substrate. In FIG. 22, the linearly related fifth material spacer portions 250 (formed with reference to FIGS. 13–21) are used as a masking layer and semiconductor substrate 200 is etched with a suitable etchant to form deep micron trenches with a suitable etchant. For example, the etching of a silicon substrate 200 may be carried out with a chlorine etch chemistry, such as for example, $BCl_3/Cl_2$, $H_2/Cl_2/SiCl_4$, and $CHCl_3/O_2/N_2$, or other suitable etch chemistry as known in the art.

FIG. 23 shows substrate 200 after the etching of deep submicron trenches 260 and the removal of fifth material spacer portions 250. The removal of the fifth material spacer portions 250 is carried out with a suitable etchant that does not etch the silicon substrate. For example, fifth material spacer portions 250 of $Si_3N_4$ may be etched with a $CHF_3/O_2$ chemistry.

FIG. 24 shows the deep submicron trenches 260 in substrate 200 filled with a dielectric material 270. Dielectric material 270 may be deposited by conventional techniques, such as for example, chemical vapor deposition of dielectric material. Another method is thermal oxidation of silicon. The structure is planarized by a suitable etchant or a chemical-mechanical polish. The device shown in FIG. 24 may be used as a substrate for a MOS transistor having channel lengths in substrate 200 that amount to quantum wires to enhance the mobility of the transistor. Such an embodiment will be subsequently discussed.

Figure 25:
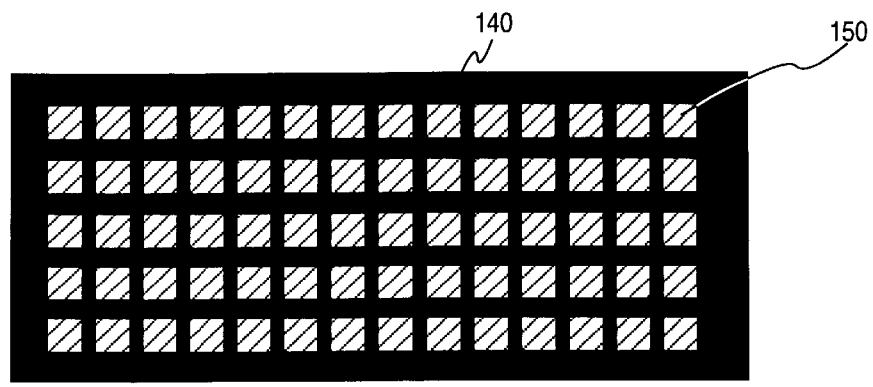
FIG. 25 is a schematic planar top view of a portion of a semiconductor substrate surface wherein submicron dots are formed in the substrate surface in accordance with a fourth embodiment of the invention.

FIG. 25 illustrates another embodiment of the invention wherein deep submicron dots are formed in substrate 200. The semiconductor dots can be used, for example, in memory applications. Using the structure shown in FIG. 24 as the starting substrate, the process steps described in FIGS. 22–24 are applied to substrate 200 at a perpendicular direction. Such process steps yield a structure having semiconductor dots, squares or rectangles 150 surrounded by dielectric material 140. During the etch processes, trench dielectric material 140 will be protected either by selective etch processes or by applying a protective layer, such as for example polysilicon, on top of substrate 150.

Figure 26:
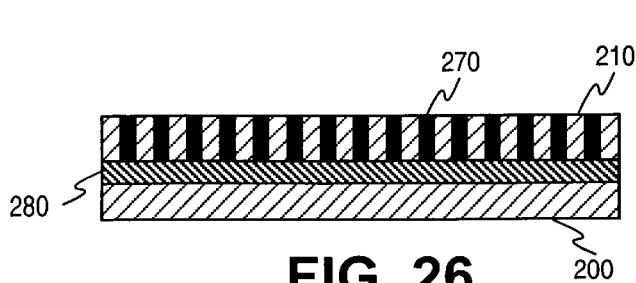
FIG. 26 is a schematic side view of a portion of a semiconductor substrate wherein a deep submicron layer is formed in the substrate and submicron trenches filled with dielectric material are formed in a portion of the substrate in accordance with a fifth embodiment of the invention.
Figure 27:
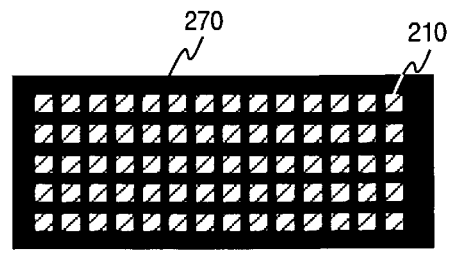
FIG. 27 is a schematic planar top view of a portion of a semiconductor substrate wherein a submicron layer is formed in a portion of the substrate and submicron dots are formed in a portion of the substrate in accordance with a sixth embodiment of the invention.

FIGS. 26 and 27 show a planar side view and top view, respectively, of another embodiment wherein a deep submicron layer 280 is formed prior to the formation of the deep submicron dots as described above with respect to FIGS. 22–25. Where trench material 270 is a dielectric material and where deep submicron layer 280 is a dielectric or an insulator, such as for example, a silicon on insulator structure, the deep submicron dots 210 formed in the processes of FIGS. 22–25 become deep submicron boxes that are confined in three dimensions.

Figure 28:
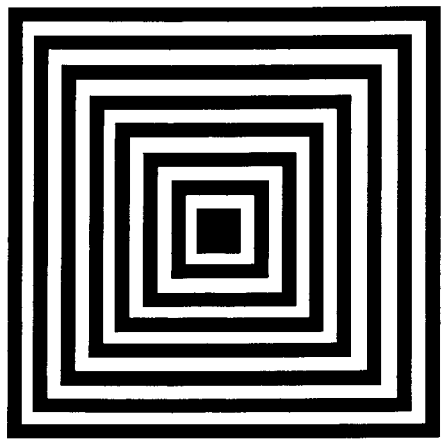
FIG. 28 is a schematic planar top view of a portion of a semiconductor substrate wherein spacers are formed with a two-dimensional pattern in accordance with a seventh embodiment of the invention.
Figure 29:
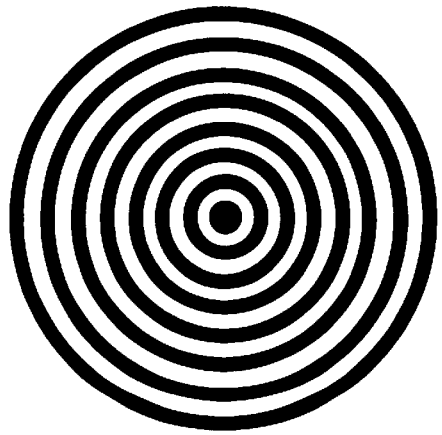
FIG. 29 is a schematic planar top view of a portion of a semiconductor substrate wherein spacers are formed in a two-dimensional pattern in accordance with a seventh embodiment of the invention.

FIGS. 28 and 29 illustrate other spacer processes that may be formed using geometrically or linearly reducing spacer processes as described above. FIG. 28 illustrates a square two-dimensional pattern while FIG. 29 illustrates a two-dimensional pattern of circles.

In the above embodiments, an example of a silicon substrate and dielectric (nitride/oxide) "disposable" spacers have been described. It is to be appreciated that the substrate and disposable spacers can be other materials as desired. Such an example is that the substrate may be chromium on glass and the reducing spacers may be used to generate deep submicron patterns for mask fabrication.

Spacers formed by the above method, whether of dielectric or conductive material, may create lines/trenches for semiconductor devices/structures below 100 Å. The generated structures can also be used in many ways in applications other than semiconductor manufacturing. For example, the multiple line/spaces may be used as optical grading. In such case, the above process may be used to define a pattern in a substrate, for example, chrome, that can be used in reticle applications.

Figure 30:
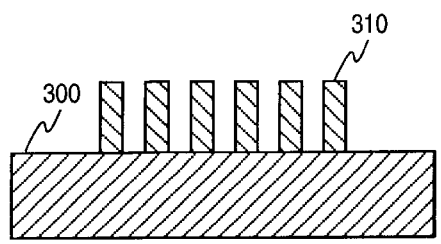
FIG. 30 is a schematic planar side view of a portion of a semiconductor substrate having spacers formed in an active region of the substrate in accordance with the eighth embodiment of the invention.
Figure 31:
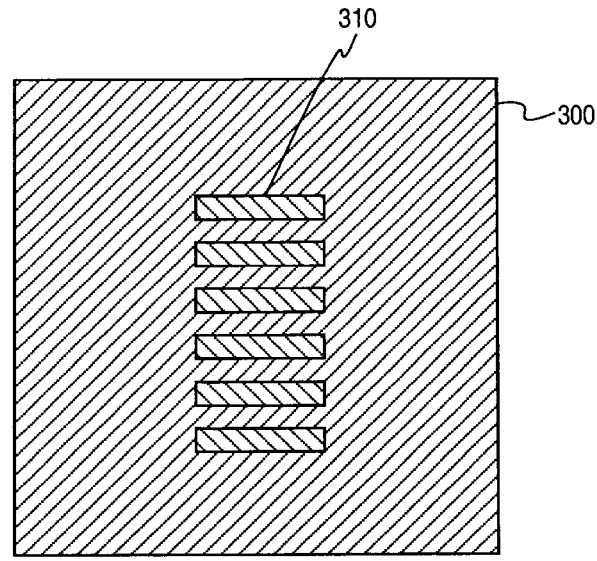
FIG. 31 is a schematic planar top view of a portion of a semiconductor substrate showing spacer portions in an active region of the substrate in accordance with the eighth embodiment of the invention.

FIGS. 30–40 illustrate a process of fabricating quantum wire transistors using hard-mask transistor width definition. FIGS. 30 and 31 show planar side views and top view of the beginning of such a transistor, respectfully. The structure of FIGS. 30 and 31 is formed using the geometrically or linearly reducing spacer process discussed above. Controlling the spacer gate process, it is possible to fabricate repeating patterns of a masking layer spacers 310 of 100 Å above substrate 300. In this example, masking layer spacers of $Si_3N_4$ are used.

Figure 32:
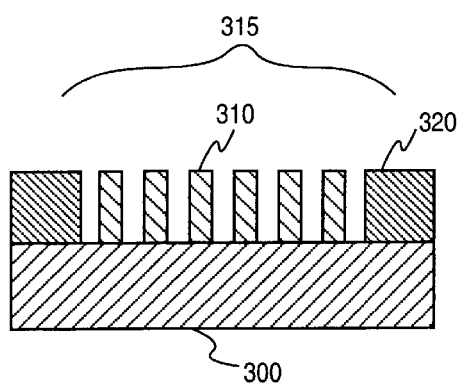
FIG. 32 is a schematic planar side view of a portion of a semiconductor substrate having spacers formed over an active region of the substrate and a masking layer defining a gate area in accordance with the eighth embodiment of the invention.
Figure 33:
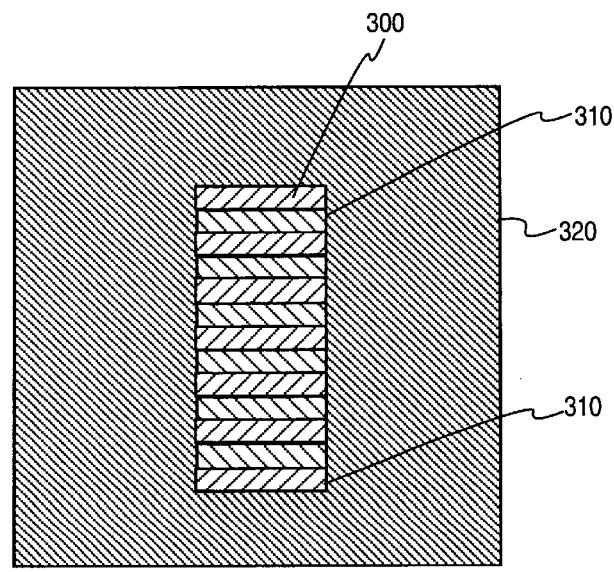
FIG. 33 is a schematic planar top view of a portion of a semiconductor substrate having spacers formed over an active region of the substrate and a masking layer defining a gate area in accordance with the eighth embodiment of the invention.

FIGS. 32 and 33 show side views and top views, respectively, of the next step of using a lithography process to cover substrate 300 in all areas except the channel region 315. The only exposed semiconductor (e.g., silicon) material 300, is in channel region 315 that is not covered by spacer portions 310, for example, $Si_3N_4$ spacer portions.

Figure 34:
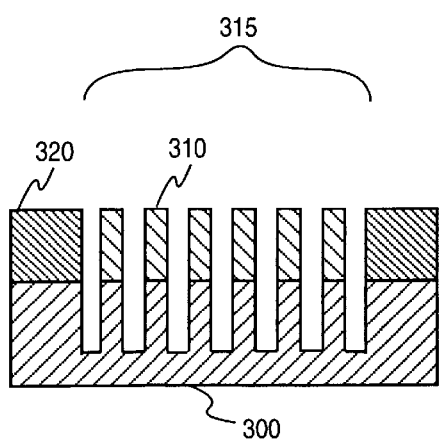
FIG. 34 is a schematic planar side view of a portion of a semiconductor substrate having spacers defining a pattern for trenches formed in the substrate in accordance with the eighth embodiment of the invention.
Figure 35:
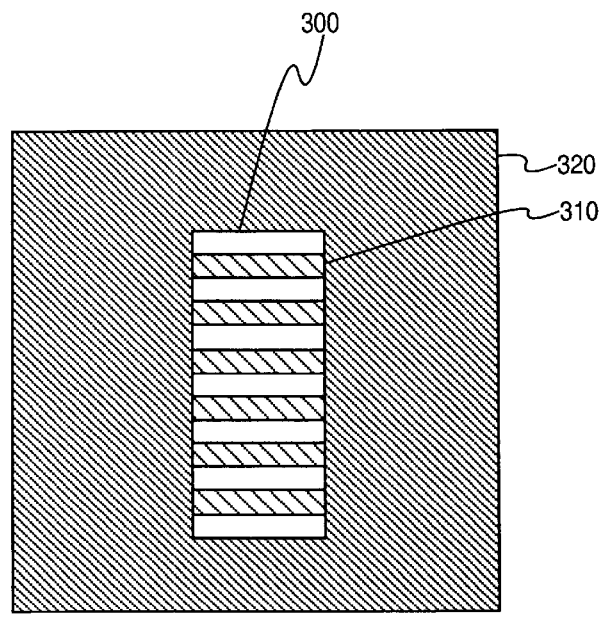
FIG. 35 is a schematic planar top view of a portion of a semiconductor substrate having spacers defining a pattern for trenches formed in the substrate in accordance with the eighth embodiment of the invention.
Figure 36:
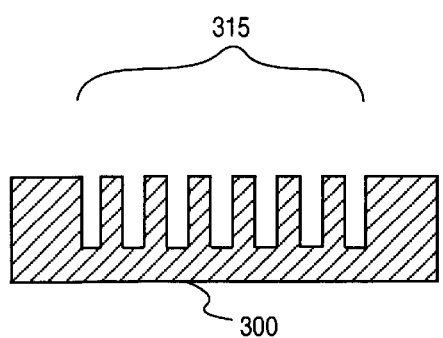
FIG. 36 is a schematic planar side view of a portion of a semiconductor substrate showing trenches formed in an active region of the substrate in accordance with the eighth embodiment of the invention.
Figure 37:
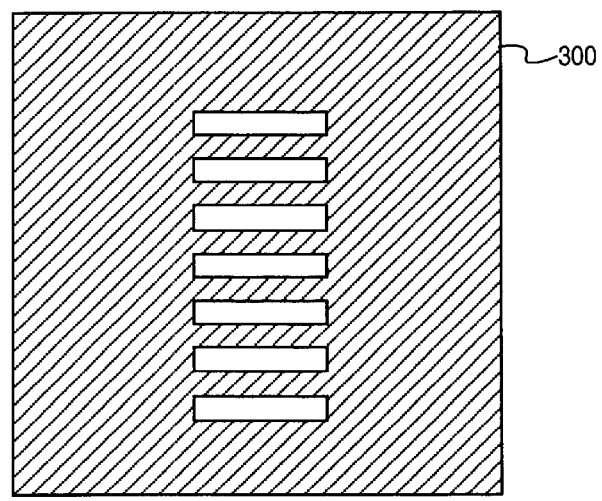
FIG. 37 is a schematic planar top view of a portion of a semiconductor substrate showing trenches formed in an active region of the substrate in accordance with the eighth embodiment of the invention.

Once the lithography step is complete and the only exposed semiconductor material 300 is in channel region 315, trenches are etched into substrate 300. The etching of trenches in substrate 300 may be carried out by a chlorine etch chemistry, such as for example, $BCl_3/Cl_2$, $H_2/Cl_2/SiCl_4$, and $CHCl_3/O_2/N_2$, or other suitable etch chemistry as known in the art. FIGS. 34 and 35 show side views and top views, respectively, of the etched substrate 300 with photoresist 320 applied over substrate 300 and masking layer 310 defining trenches in channel region 315 of substrate 300. Photoresist 320 is stripped by conventional processes and then $Si_3N_4$ spacer portions 310 are removed, for example, with a $CHF_3/O_2$ etch chemistry. FIGS. 36 and 37 show side views and top views, respectively, of submicron trenches formed in channel region 315 of substrate 300.

Figure 38:
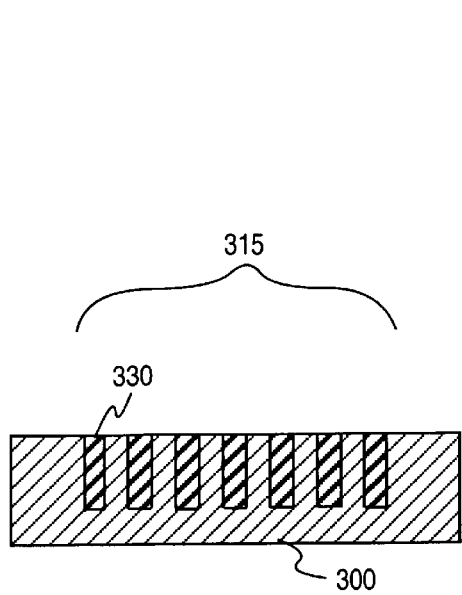
FIG. 38 is a schematic planar side view of a portion of a semiconductor substrate having dielectric filled trenches in an active region of the substrate in accordance with the eighth embodiment of the invention.
Figure 39:
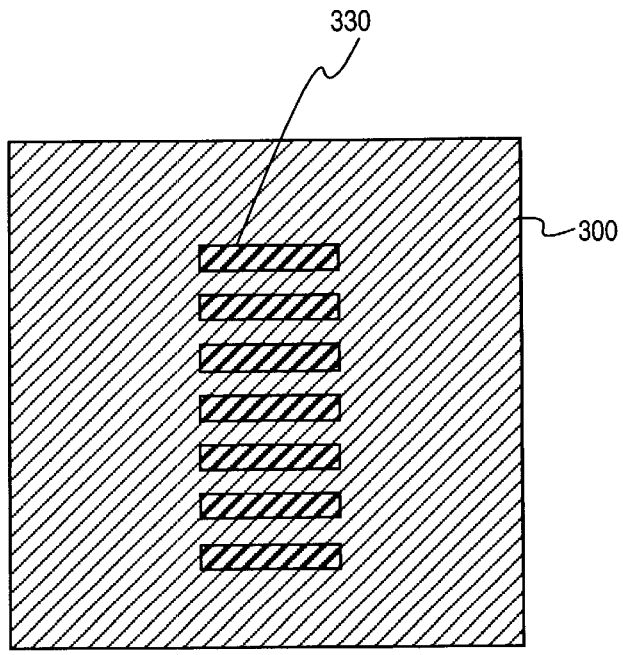
FIG. 39 is a schematic planar top view of a portion of a semiconductor substrate having dielectric filled trenches in an active region of the substrate in accordance with the eighth embodiment of the invention.

FIGS. 38 and 39 show side views and top views, respectively, of the subsequent processing step of filling the submicron trenches in channel region 315 of substrate 300 with a dielectric material. Dielectric material 330 may be deposited by conventional techniques, such as for example chemical vapor deposition of dielectric material (e.g., $SiO_2$) and polished back to the substrate 300 wafer level. It is to be appreciated that dielectric material may be any dielectric, such as for example, $SiO_2$, $Si_3N_4$, or other materials. Dielectric material 330 may also be grown, for example by thermal oxidation of silicon substrate 300. The structure illustrated in FIGS. 38 and 39 show dielectric material 330 formed trenches in channel region 315 of substrate 300 with the top level of the structure substantially planarized.

Figure 40:
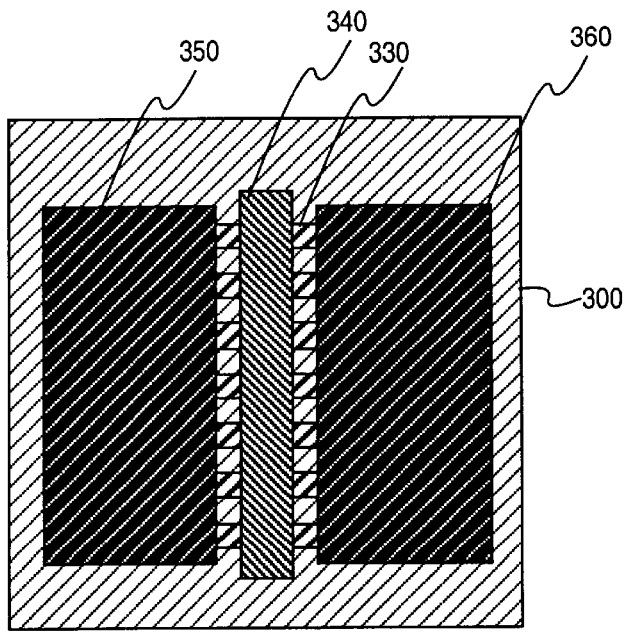
FIG. 40 is a schematic planar top view of a transistor formed in an active region of the substrate in accordance with the eighth embodiment of the invention.

Once the submicron dielectric trenches are formed, standard transistor processing steps (such as for example CMOS processing steps) are followed to produce the desired transistors. Dielectric filled trench material 330 should not be damaged during the transistor processing steps. To avoid damage, a cap may be applied, such as for example a $SiO_2$ or gate oxide. FIG. 40 shows a transistor formed in an active region of substrate 300. The transistor includes a gate 340 overlying, in a perpendicular direction, dielectric material filled trenches 330. Adjacent gate 340 and dielectric material filled trenches 330. Adjacent gate 340 and dielectric material filled trenches 330 are source and drain regions, 350 and 360, respectively. In various embodiments, the source region 350 has a depth substantially equivalent to the depth of the dielectric material filled trenches 330. Similarly, the drain region 360 can have a depth substantially equivalent to the depth of the dielectric material filled trenches 330. In other embodiments, the depth of the dielectric material filled trenches 330 is greater than one of the source region depth and the drain region depth.

The above process addresses the limitations on scaling and standard scaling techniques to continued process integration. Specifically, the structure addresses the transistor mobility, a factor in increasing the drain saturation current ($I_{Dsat}$). The above process produces quantum wire MOS transistors, wherein a series of channel fingers, each of whose dimensions may be on the order of 100 Å are used to quantize the current into quantum wires, which greatly reduces the scattering of the inversion layer charge and thus greatly increases the transistors mobility. This increase in drain saturation current increases chip performance which increases chip speeds.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A field effect transistor, comprising:
   a semiconductor substrate having a source region and a drain region;
   a gate area formed on a surface of said substrate; and
   a channel region in said substrate having a cross-sectional area defined by a portion of said gate area, a channel length measured across a portion of the channel region between said source region and said drain region,
   wherein a portion of said channel region has a plurality of trenches formed therein, said trenches having a trench length substantially equivalent to said channel length and dielectric material disposed within and substantially filling said plurality of trenches such that said dielectric material and said substrate surface form a uniform surface upon which said gate area is disposed.

2. The transistor of claim 1, wherein said source region has a source depth and wherein at least one of said plurality of trenches has a trench depth substantially equivalent to said source depth.

3. The transistor of claim 1, wherein said drain region has a drain depth and wherein at least one of said plurality of trenches has a trench depth substantially equivalent to said drain depth.

4. The transistor of claim 1, wherein said source region has a source depth and said drain region has a drain depth and wherein at least one of said plurality of trenches has a trench depth greater than one of said source depth and said drain depth.

5. The transistor of claim 1, wherein each of said plurality of trenches has dimensions substantially equivalent to each other.

6. The transistor of claim 5, wherein each of said plurality of trenches are substantially equidistant from one another.

7. The transistor of claim 1, wherein each of said plurality of trenches is substantially equidistant from one another.

* * * * *